(12) United States Patent
Shim

(10) Patent No.: US 8,680,904 B1
(45) Date of Patent: Mar. 25, 2014

(54) SEMICONDUCTOR DEVICE INCLUDING DELAY LOCKED LOOP CIRCUIT AND METHOD

(71) Applicant: SK hynix Inc., Gyeonggi-do (KR)

(72) Inventor: Seok-Bo Shim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,126

(22) Filed: Dec. 18, 2012

(30) Foreign Application Priority Data

Aug. 28, 2012 (KR) .................. 10-2012-0094357

(51) Int. Cl.
*H03L 7/06* (2006.01)

(52) U.S. Cl.
USPC ........................................ 327/158; 327/149

(58) Field of Classification Search
USPC .................................................. 327/149, 158
See application file for complete search history.

(56) References Cited

U.S. PATENT DOCUMENTS

| | | | | |
|---|---|---|---|---|
| 6,944,833 B2* | 9/2005 | Jeon | | 327/158 |
| 7,372,311 B2* | 5/2008 | Kang | | 327/158 |
| 7,696,799 B2* | 4/2010 | Kim | | 327/158 |
| 2004/0054977 A1* | 3/2004 | Jeon | | 716/10 |
| 2006/0152259 A1* | 7/2006 | Lee et al. | | 327/158 |
| 2006/0197565 A1* | 9/2006 | Kang | | 327/158 |
| 2007/0069780 A1* | 3/2007 | Kim | | 327/158 |
| 2011/0001526 A1* | 1/2011 | Hong et al. | | 327/158 |
| 2012/0105118 A1* | 5/2012 | Yoon | | 327/158 |
| 2012/0269014 A1* | 10/2012 | Kim | | 365/193 |
| 2013/0187689 A1* | 7/2013 | Choi | | 327/157 |

FOREIGN PATENT DOCUMENTS

| | | |
|---|---|---|
| KR | 1020020055910 | 7/2002 |
| KR | 1020050041677 | 5/2005 |

* cited by examiner

*Primary Examiner* — Adam Houston
(74) *Attorney, Agent, or Firm* — IP & T Group LLP

(57) ABSTRACT

A semiconductor device includes a delay locked loop unit configured to compare a phase of an internal clock with a phase of a feedback clock to delay the internal clock by a delay amount corresponding to a comparison result, and to output a delay locked clock, a delay replica modeling unit configured to output the feedback clock by reflecting a transfer delay amount of the internal clock used in an internal circuit into the delay locked clock, and to adjust the transfer delay amount in response to a delay replica adjustment signal, and a delay replica adjustment signal generation unit configured to compare the phase of the feedback clock with a phase of the delay locked clock, and to set a value of the delay replica adjustment signal in response to a comparison result.

20 Claims, 3 Drawing Sheets

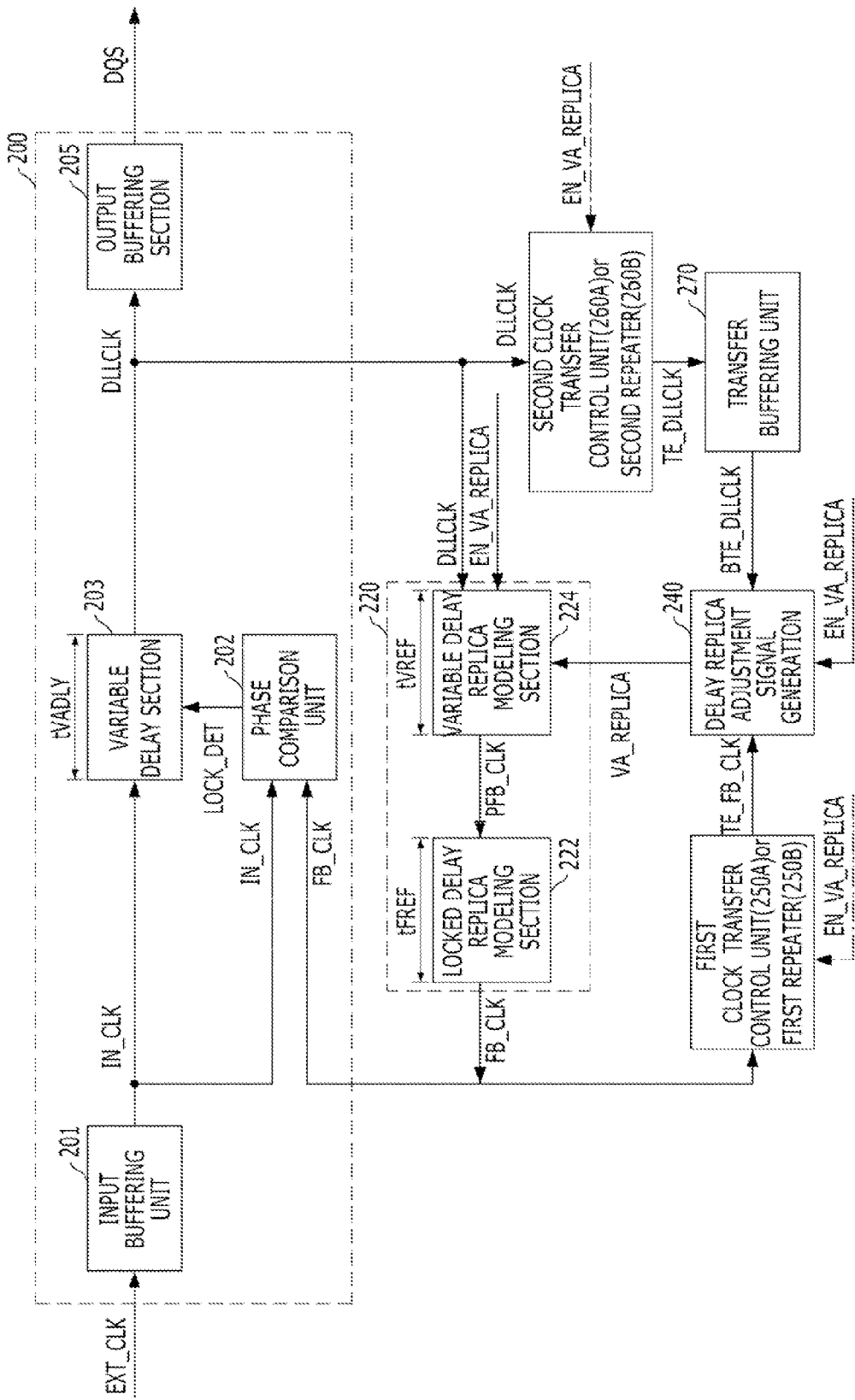

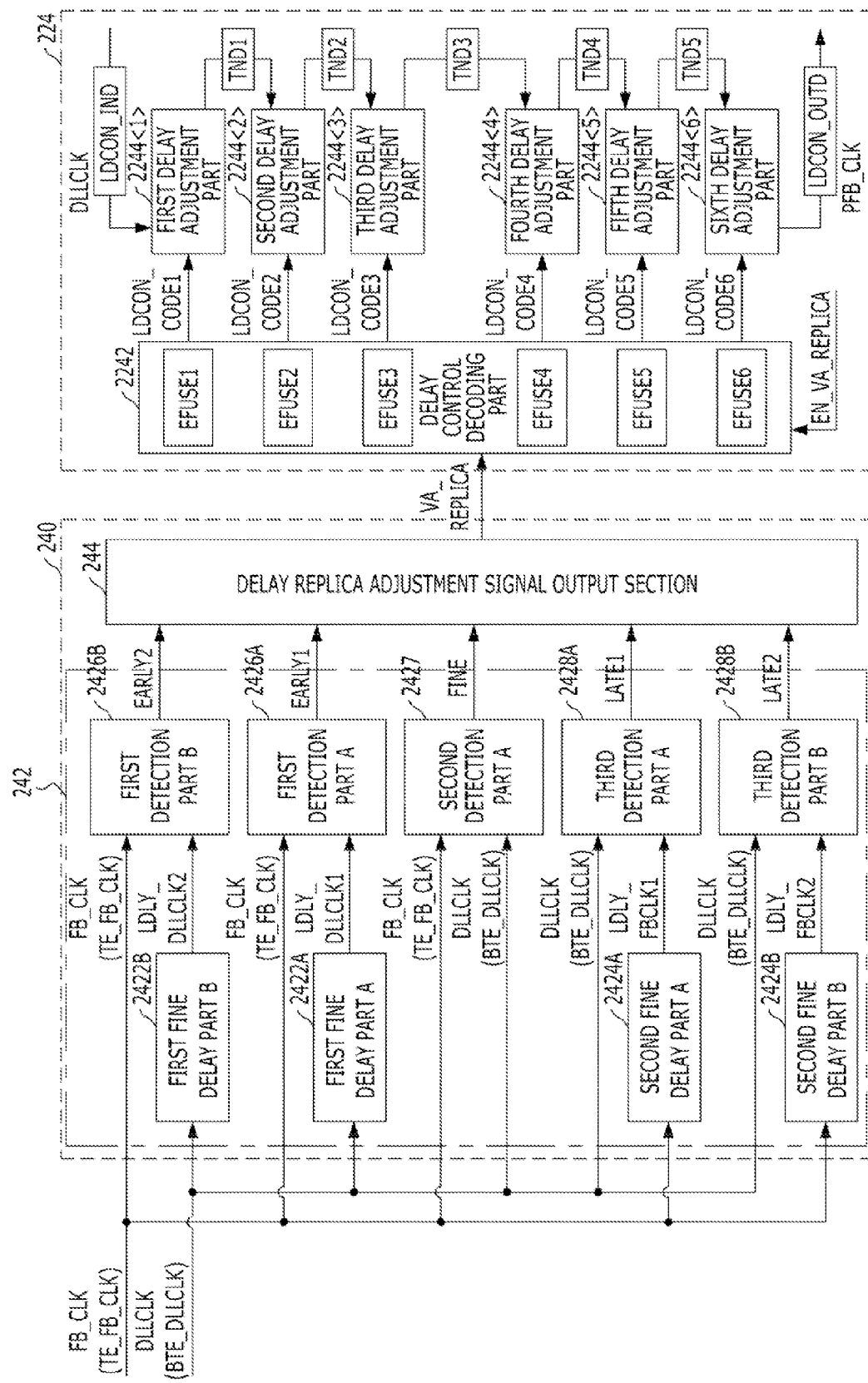

SEMICONDUCTOR DEVICE INCLUDING DELAY LOCKED LOOP CIRCUIT AND METHOD

CROSS-REFERENCE TO RELATED APPLICATIONS

The present application claims priority of Korean Patent Application No. 10-2012-0094357, filed on Aug. 28, 2012, which is incorporated herein by reference in its entirety.

BACKGROUND

1. Field

Exemplary embodiments of the present invention relate to a semiconductor design technology, particularly, to a delay locked loop circuit of a semiconductor device, and more particularly, to a delay locked loop circuit capable of adjusting clock-related specifications at a package level by itself.

2. Description of the Related Art

A synchronous semiconductor device, such as a double data rate synchronous DRAM (DDR SDRAM), transmits data to external devices using an internal clock synchronized with an external clock inputted from an external device such as a memory controller CTRL.

In order to stably transmit data between a memory and a memory controller a temporal synchronization between an external clock applied from the memory controller and data outputted from the memory is very important.

The memory outputs data in synchronization with an internal clock. The internal clock is synchronized with the external clock when it is initially applied to the memory, but the internal clock is delayed while passing through elements in the memory. Thus, the data is outputted to an exterior of the memory in a state in which it is not synchronized with the external clock.

In order to stably transmit data outputted from the memory, the internal clock, which has been delayed while passing through the elements in the memory for transmitting the data, should exactly match with the edge or center of the external clock applied from the memory controller. To this end, the internal clock should be synchronized with the external clock by reversely compensating for time for loading data on a bus.

A clock synchronization circuit for playing such a role includes a phase locked loop (PLL) circuit and a delay locked loop (DLL) circuit.

When frequencies of the external clock and the internal clock are different from each other, the phase locked loop (PLL) circuit is mainly used because a frequency multiplication function is needed. Meanwhile, when the frequencies of the external clock and the internal clock are substantially equal to each other, the delay locked loop (DLL) circuit is mainly used because it is not greatly affected by noise and may be implemented in a relatively small area, as compared with the phase locked loop (PLL) circuit.

That is since semiconductor memory elements commonly use substantially the same frequency, the delay locked loop (DLL) circuit is mainly used as the clock synchronization circuit.

FIG. 1 is a block diagram illustrating a delay locked loop (DLL) circuit of a general semiconductor device.

Referring to FIG. 1, the delay locked loop (DLL) circuit of the general semiconductor device includes a clock input buffering unit 10, a phase comparison unit 20, a variable delay unit 30, a delay replica model unit 40, and a clock output buffering unit 50. The clock input buffering unit 10 buffers an external clock EXT_CLK and generates an internal clock IN_CLK. The phase comparison unit 20 compares a phase of the internal clock IN_CLK with a phase of a feedback clock FB_CLK to generate a phase detection signal LOCK_DET according to a comparison result. The variable delay unit 30 delays the internal clock IN_CLK by a variable delay amount in response to the phase detection signal LOCK_DET, and outputs a delay locked clock DLLCLK. The delay replica model unit 40 delays the delay locked clock DLLCLK by a delay amount obtained by modeling a delay path of the internal clock IN_CLK in an internal circuit, and outputs the feedback clock FB_CLK. The clock output buffering unit 50 buffers the delay locked clock DLLCLK and outputs a data strobe signal DQS.

Meanwhile, a parameter indicating a time difference between the external clock EXT_CLK and the data strobe signal DQS includes a parameter 'tDQSCK'. The most basic operation object of the delay locked loop (DLL) circuit is to synchronize data outputted from the semiconductor device with the external clock EXT_CLK by allowing the value of the parameter "tDQSCK" to be approximate to '0' if possible.

In order to allow the value of the parameter 'tDQSCK' to be approximate to '0' if possible, the most important factor is to model the delay amount, which is modeled by the delay replica model unit 40, to be approximate to an actual delay amount. That is, since the delay amount modeled by the delay replica model unit 40 is very large and has the most significant influence on a result of the delay locked loop (DLL) circuit, there should be no difference between the size of a delay amount modeled by the delay replica model unit 40 and corresponding to the delay path of the internal clock IN_CLK in the internal circuit and the size of an actual delay amount by which the internal clock IN_CLK is delayed in the internal circuit, in order to allow the value of the parameter 'tDQSCK' to be approximate to '0' if possible.

However, since the delay replica model unit 40 simply models the delay amount corresponding to the delay path of the internal clock IN_CLK in the internal circuit, it is not possible to remove a difference between the size of the delay amount corresponding to the delay path of the internal clock IN_CLK in the internal circuit and the size of the actual delay amount during an actual operation. Particularly, when the delay amount of the delay replica model unit 40 is determined once in a design process, the determined delay amount is simultaneously applied to numerous semiconductor devices in mass production. Although the delay amount of the delay replica model unit 40 is exactly determined in a design process, there is a difference in the delay amount of the delay replica model unit 40, which is applied to respective semiconductor devices, due to various peripheral factors in mass production.

In order to solve such problems, in the conventional art, there has been used a method in which a fuse option and the like capable of adjusting the delay amount are put into the delay replica model unit 40, and the fuse option of the delay replica model unit 40 is adjusted for respective semiconductor devices through a 'tDQSCK' test in a process of performing a test operation for produced semiconductor devices, so that the delay amount of the delay replica model unit 40 is adjusted.

However, in the conventional method, much time is required for performing the test. That is, in the conventional method, since it is necessary to detect 'tDQSCK' values for the respective semiconductor devices and to adjust the fuse option of the delay replica model unit 40 included in the respective semiconductor devices based on the detected values, much time is required for performing the test.

SUMMARY

An exemplary embodiment includes is directed to a delay locked loop circuit capable of adjusting clock-related specifications at a package level.

In accordance with an exemplary embodiment, a semiconductor device includes: a delay locked loop unit configured to compare a phase of an internal clock with a phase of a feedback clock to delay the internal clock by a delay amount corresponding to a comparison result, and to output a delay locked clock, a delay replica modeling unit configured to output the feedback clock by reflecting a transfer delay amount of the internal clock used in an internal circuit into the delay locked clock, and to adjust the transfer delay amount in response to a delay replica adjustment signal, and a delay replica adjustment signal generation unit configured to compare the phase of the feedback clock with a phase of the delay locked clock, and to set a value of the delay replica adjustment signal in response to a comparison result.

In accordance with another exemplary embodiment, a semiconductor device includes: a delay locked loop unit configured to delay an internal clock by a delay amount based on a phase difference between the internal clock and a feedback clock, and output a delay locked clock, a delay replica modeling unit configured to generate the feedback clock based on the delay locked clock and a transfer delay amount that is based on a phase difference between the feedback clock and the delay locked clock, and a repeater unit configured to repeat the feedback clock and the delay locked clock inputted to the delay replica modeling unit.

In accordance with still another exemplary embodiment, a method includes: comparing, via a delay locked loop unit, a phase of an internal clock with a phase of a feedback clock to generate a comparison result; delaying, via the delay locked loop unit, the internal clock by a delay amount corresponding to the comparison result; outputting, via the delay locked loop unit, a delay locked clock; receiving, via a delay replica modeling unit, the delay locked clock; generating, via the delay replica modeling unit, the feedback clock based on a transfer delay amount of the internal clock; and adjusting, via the delay replica modeling unit, the transfer delay amount based on a delay replica adjustment signal; and comparing, via a delay replica adjustment signal generation unit, the phase of the feedback clock with a phase of the delay locked clock; setting, via the delay replica adjustment signal generation unit, a value of the delay replica adjustment signal based on the comparison; and outputting, via the delay replica adjustment signal generation unit, the delay replica adjustment signal to the delay replica modeling unit.

According to an exemplary embodiment, an operation for detecting a phase difference between the delay locked clock DLLCLK and the feedback clock FB_CLK and adjusting the delay amount of the delay replica modeling circuit is performed in the delay locked loop (DLL) circuit, so that it is possible for the delay locked loop (DLL) circuit to adjust clock-related specifications by itself.

Consequently, even after a semiconductor device is packaged, clock-related specifications are adjustable in the semiconductor device, so that it is possible to minimize a time required for a test.

BRIEF DESCRIPTION OF THE DRAWINGS

FIG. 2 is a block diagram illustrating a delay locked loop (DLL) circuit in accordance with an exemplary embodiment.

FIG. 3 is a detailed block diagram illustrating a delay replica adjustment signal generation unit and a variable delay replica modeling unit of elements of a delay locked loop (DLL) circuit in accordance with an exemplary embodiment illustrated in FIG. 2.

DETAILED DESCRIPTION

Figure 1:
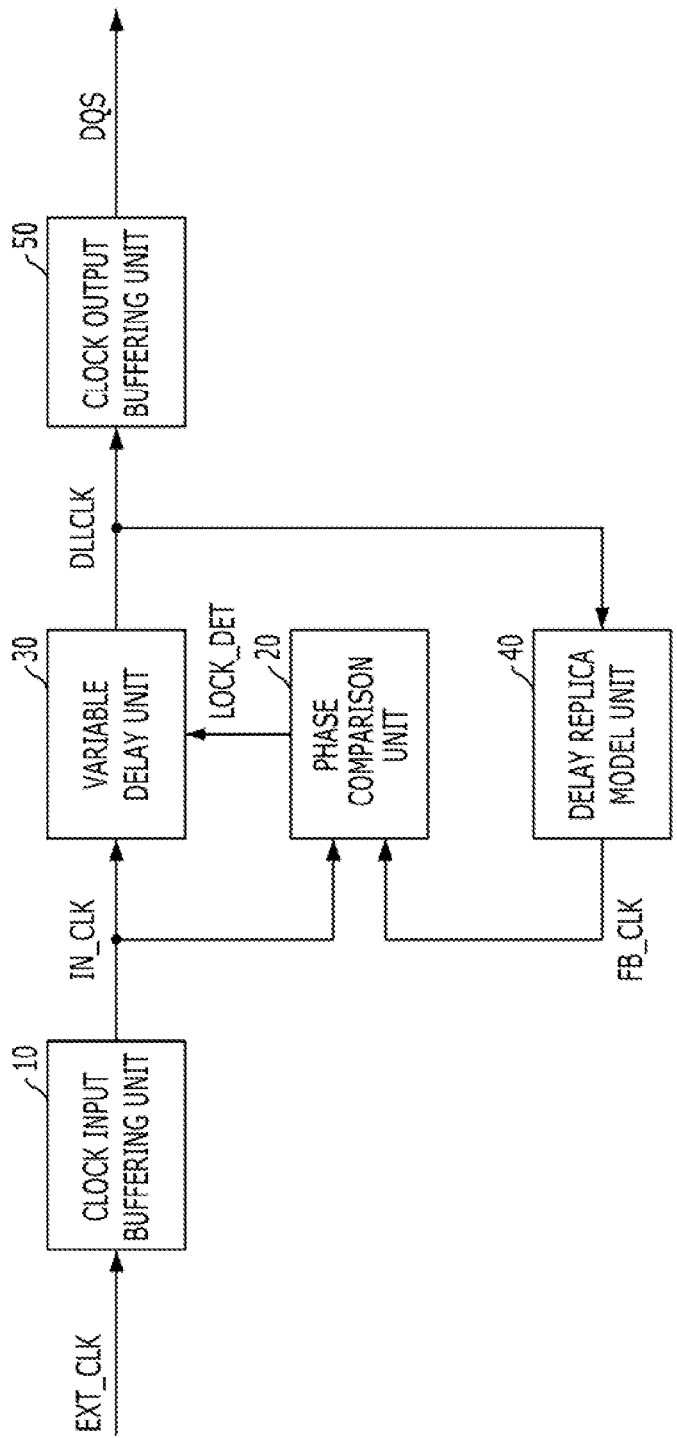
FIG. 1 is a block diagram illustrating a delay locked loop (DLL) circuit of a conventional semiconductor device.

Exemplary embodiments will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Throughout the disclosure, like reference numerals refer to like parts throughout the various figures and exemplary embodiments.

FIG. 2 is a block diagram illustrating a delay locked loop (DLL) circuit in accordance with an exemplary embodiment.

Referring to FIG. 2, the delay locked loop (DLL) circuit, in accordance with an exemplary embodiment, includes a delay locked loop unit 200, a delay replica modeling unit 220, and a delay replica adjustment signal generation unit 240. The delay locked loop unit 200 is configured to compare a phase of an internal clock IN_CLK with a phase of a feedback clock FB_CLK to delay the internal clock IN_CLK by a delay amount corresponding to a comparison result, and to output a delay locked clock DLLCLK. The delay replica modeling unit 220 is configured to output the feedback clock FB_CLK by reflecting a transfer delay amount (tVREF+tFREF) of the internal clock IN_CLK used in an internal circuit into the delay locked clock DLLCLK, and to adjust the transfer delay amount (tVREF+tFREF) in response to a delay replica adjustment signal VA_REPLICA. The delay replica adjustment signal generation unit 240 is configured to compare the phase of the feedback clock FB_CLK with a phase of the delay locked clock DLLCLK, and to set a value of the delay replica adjustment signal VA_REPLICA in response to a comparison result.

The delay replica modeling unit 220 includes a variable delay replica modeling section 224 and a fixed delay replica modeling section 222. The variable delay replica modeling section 224 is configured to delay the delay locked clock DLLCLK by a first delay amount tVREF changed in response to the delay replica adjustment signal VA_REPLICA, and to output a pre-feedback clock PFB_CLK. The fixed delay replica modeling section 222 is configured to delay the pre-feedback clock PFB_CLK by a second delay amount tFREF and to output the feedback clock FB_CLK. That is, the first delay amount tVREF of the variable delay replica modeling section 224 may be adjusted in response to the value of the delay replica adjustment signal VA_REPLICA, while the value of the second delay amount tFREF is not changed later since the value of the second delay amount tFREF of the fixed delay replica modeling section 222 is determined in a design thereof.

The delay locked loop unit 200 includes an input buffering unit 201, a phase comparison unit 202, a variable delay section 203, and an output buffering section 205. The input buffering unit 201 is configured to buffer an external clock EXT_CLK and output the internal clock IN_CLK. The phase comparison unit 202 is configured to compare the phase of the internal clock IN_CLK with the phase of the feedback clock FB_CLK to output a phase detection signal LOCK_DET. The variable delay section 203 is configured to delay the internal clock IN_CLK by a delay amount tVADLY changed in response to the phase detection signal LOCK_DET, and to output the delay locked clock DLLCLK. The output buffering section 205 is configured to buffer the delay locked clock DLLCLK and output the delay locked clock DLLCLK to an exterior as a data strobe signal DQS.

The delay locked loop (DLL) circuit in accordance with an exemplary further includes a transfer buffering unit 270 configured to have a size substantially equal to that of the output buffering section 205 included in the delay locked loop unit 200, to buffer the delay locked clock DLLCLK, and to transfer the buffered clock to the delay replica adjustment signal generation unit 240. The transfer buffering unit 270 is an element for transferring a clock BTE_DLLCLK to the delay replica adjustment signal generation unit 240, wherein the clock BTE_DLLCLK substantially equal to the data strobe signal DQS obtained by buffering the delay locked clock DLLCLK by the output buffering section 205. That is, the transfer buffering unit 270 may be a dummy element obtained by modeling the output buffering section 205.

The delay locked loop (DLL) circuit in accordance with the embodiment of the present invention selectively includes one or more of the following clock transfer control units 250A and 260A or repeaters 250B and 260B.

First, a description will be provided for a configuration in which the delay locked loop (DLL) circuit in accordance with an exemplary embodiment further includes the clock transfer control units 250A and 260B. The delay locked loop (DLL) circuit includes the first clock transfer control unit 250A and the second clock transfer control unit 260A. The first clock transfer control unit 250A is configured to be provided between the delay replica modeling unit 220 and the delay replica adjustment signal generation unit 240, and to on/off control the transfer of the feedback clock FB_CLK in response to a delay replica adjustment enable signal EN_VA_REPLICA. The second clock transfer control unit 260A is configured to be provided between the delay locked loop unit 200 and the delay replica adjustment signal generation unit 240, and to on/off control the transfer of the delay locked clock DLLCLK in response to the delay replica adjustment enable signal EN_VA_REPLICA. That is, the clock transfer control units 250A and 260A are elements for substantially preventing clocks TE_DLLCLK and TE_FB_CLK from being inputted to the delay replica adjustment signal generation unit 240, in response to the delay replica adjustment enable signal EN_VA_REPLICA. Consequently, in a period in which the delay replica adjustment enable signal EN_VA_REPLICA is deactivated, it is possible to obtain an effect as if the delay replica adjustment signal generation unit 240 does not exist.

Of course, since the operation of the delay replica adjustment signal generation unit 240 is also on/off controlled according to the activation or deactivation of the delay replica adjustment enable signal EN_VA_REPLICA and performs no operations in the period in which the delay replica adjustment enable signal EN_VA_REPLICA is deactivated, the delay replica adjustment signal generation unit 240 does not have an influence on an entire operation although the clock transfer control units 250A and 260A do not exist. That is, the clock transfer control units 250A and 260A are not essential elements of the present invention. However, since there is a current consumed in a clock transfer process, when the clock transfer control units 250A and 260A exist, current consumption may be further reduced.

Furthermore, in FIG. 2, the delay locked clock DLLCLK is transferred to the transfer buffering unit 270 through the second clock transfer control unit 260A as the clock TE_DLLCLK, and the transfer buffering unit 270 buffers the transferred clock TE_DLLCLK and transfers the buffered clock to the delay replica adjustment signal generation unit 240 as the clock BTE_DLLCLK.

In an exemplary embodiment, the delay locked loop (DLL) circuit in further includes first repeater 250B and second repeater 260B. The first repeater 250B is configured to be provided between the delay replica modeling unit 220 and the delay replica adjustment signal generation unit 240, and to repeat the transfer of the feedback clock FB_CLK. The second repeater 260B is configured to be provided between the delay locked loop unit 200 and the delay replica adjustment signal generation unit 240 and to repeat the transfer of the delay locked clock DLLCLK. That is, when considering the fact that the delay locked clock DLLCLK and the feedback clock FB_CLK are connected to the phase comparison section 202 and the delay replica modeling unit 220 in a parallel manner and are inputted to the delay replica adjustment signal generation unit 240, the first repeater 250B and the second repeater 260B are elements for substantially preventing the delay locked clock DLLCLK and the feedback clock FB_CLK from affecting the operations of the phase comparison unit 202 and 220, to which the delay locked clock DLLCLK and the feedback clock FB_CLK are connected in a parallel manner, and for substantially preventing jitter from occurring in the delay locked clock DLLCLK and the feedback clock FB_CLK transferred to the delay replica adjustment signal generation unit 240.

That is, when clock signals with a high frequency, such as the delay locked clock DLLCLK and the feedback clock FB_CLK, are connected in a parallel manner as illustrated in FIG. 2, since noise or jitter generated by the parallel connection may have a significant influence on the operations of the elements 202 and 220, the repeaters 250B and 260B are elements for substantially preventing the noise or the jitter.

Furthermore, in FIG. 2, when the delay replica adjustment enable signal EN_VA_REPLICA is applied to the clock transfer control units 250A and 260A or the repeaters 250B and 260B, it is indicated by dotted lines. This is for indicating a difference when the delay replica adjustment enable signal EN_VA_REPLICA is inputted to the clock transfer control units 250A and 260A, but is not inputted to the repeaters 250B and 260B. In the aforementioned description, a case, in which one element of the clock transfer control units 250A and 260A and the repeaters 250B and 260B are included, has been separately described. However, in an exemplary embodiment in both the clock transfer control units 250A and 260A and the first repeater 250B and the second repeater 260B. Furthermore, the name of the signal is changed whenever the signal passes through the clock transfer control units 250A and 260A, the first repeater 250B, the second repeater 260B, and the transfer buffering unit 270, i.e., DLLCLK→TE_DLLCLK→BTE_DLLCLK, FB_CLK→TE_FB_DLLCLK. This is only for distinguishing signals passing through the elements 250A, 260A, 250B, 260B, and 270 from one another, and the signals may actually be the same clock.

In the configuration of the delay locked loop (DLL) circuit, in accordance with an exemplary embodiment, an activation period of the delay replica adjustment enable signal EN_VA_REPLICA, which is used in order to control the operations of the delay replica adjustment signal generation unit 240, the clock transfer control units 250A and 260A, and the variable delay replica modeling section 224, may be defined through a scheme in which an activation period is preset in the semiconductor device such as a memory register set (MRS).

That is, the delay locked loop (DLL) circuit, in accordance with an exemplary embodiment, is able to adjust to the delay amount of the delay replica modeling unit 220 without receiving a signal from an exterior.

FIG. 3 is a detailed block diagram illustrating the delay replica adjustment signal generation unit 240 and the variable delay replica modeling unit 220 of the elements of the delay locked loop (DLL) circuit accordance with an exemplary embodiment of the present invention illustrated in FIG. 2.

Referring to FIG. 3, the delay replica adjustment signal generation unit 240 includes a phase detection section 242 and a delay replica adjustment signal output section 244. The phase detection section 242 is configured to receive the delay locked clock DLLCLK as a sampling clock, to receive the feedback clock FB_CLK as a target clock, and to output a plurality of detection signals EARLY1, EARLY2, FINE, LATE1, and LATE2 by detecting a phase difference between the two clocks. The delay replica adjustment signal output section 244 is configured to output the delay replica adjustment signal VA_REPLICA having a value which is adjusted in response to output the detection signals EARLY1, EARLY2, FINE, LATE1, and LATE2.

The fact that the delay locked clock DLLCLK applied to the phase detection section 242 serves as the sampling clock and the feedback clock FB_CLK applied to the phase detection section 242 serves as the target clock represents that the logic level value of the feedback clock FB_CLK is detected at a preset edge of the delay locked clock DLLCLK while locking the phase of the feedback clock FB_CLK and adjusting the phase of the delay locked clock DLCLK. At this time, the preset edge may be a rising edge or a falling edge. In the aforementioned description, the delay locked clock DLLCLK serves as the sampling clock and the feedback clock FB_CLK serves as the target clock. However, this may be changed by a designer. That is, the delay locked clock DLLCLK may serve as the target clock and the feedback clock FB_CLK may serve as the sampling clock.

The phase detection section 242 includes first fine delay parts 2422A and 2422B, second fine delay parts 2424A and 2424B, first detection parts 2426A and 2426B, a second detection part 2427, and third detection parts 2428A and 2428B. The first fine delay parts 2422A and 2422B are configured to finely delay the delay locked clock DLLCLK by the preset number of times step by step, and to generate a plurality of first fine delay clocks LDLY_DLLCLK1 and LDLY_DLLCLK2. The second fine delay parts 2424A and 2424B are configured to finely delay the feedback clock FB_CLK by the preset number of times step by step, and to generate a plurality of second fine delay clocks LDLY_FBCLK1 and LDLY_FBCLK2. The first detection parts 2426A and 2426B are configured to detect the logic level of the feedback clock FB_CLK at the preset edges of the plurality of first fine delay clocks LDLY_DLLCLK1 and LDLY_DLLCLK2, and to generate a plurality of first detection signals EARLY1 and EARLY2. The second detection part 2427 is configured to detect the logic level of the feedback clock FB_CLK at the preset edge of the delay locked clock DLLCLK, and to generate a second detection signal FINE. The third detection parts 2428A and 2428B are configured to detect the logic levels of the plurality of second fine delay clocks LDLY_FBCLK1 and LDLY_FBCLK2 at the preset edge of the delay locked clock DLLCLK, and to generate a plurality of third detection signals LATE1 and LATE2.

The first fine delay parts 2422A and 2422B include a primary first fine delay part 2422A configured to delay the delay locked clock DLLCLK by a first fine delay amount, and to output a primary first fine delay clock LDLY_DLLCLK1, and a secondary first fine delay part 2422B configured to delay the delay locked clock DLLCLK by a second fine delay amount, and to output a secondary first fine delay clock LDLY_DLLCLK2. The size of the second fine delay amount of the secondary first fine delay part 2422B is about twice as large as that of the first fine delay amount of the primary first fine delay part 2422A. In an exemplary embodiment of the present invention, the first fine delay parts 2422A and 2422B include two elements. However, this is for illustrative purposes only and the first fine delay parts 2422A and 2422B may include three or more elements. When the first fine delay parts 2422A and 2422B include three or more elements, an interval among the sizes of the delay amounts of the elements may be adjusted by a designer. For example, when the first fine delay parts 2422A and 2422B include four elements, the first element may be set to delay the delay locked clock DLLCLK by the fine delay amount, the second element may be set to delay the delay locked clock DLLCLK by a fine delay amount about twice as large as the fine delay amount, the third element may be set to delay the delay locked clock DLLCLK by a fine delay amount about three times as large as the fine delay amount, and the fourth element may be set to delay the delay locked clock DLLCLK by a fine delay amount about four times as large as the fine delay amount.

Similarly, the second fine delay parts 2424A and 2424B include a primary second fine delay part 2424A configured to delay the feedback clock FB_CLK by a first fine delay amount, and to output a primary second fine delay clock LDLY_FBCLK1, and a secondary second fine delay part 2424B configured to delay the feedback clock FB_CLK by a second fine delay amount, and to output a secondary second fine delay clock LDLY_FBCLK2. The size of the first fine delay amount of the primary second fine delay part 2424A is substantially equal to the size of the first fine delay amount of the primary first fine delay part 2422A, and the size of the second fine delay amount of the secondary second fine delay part 2424B is substantially equal to the size of the second fine delay amount of the secondary first fine delay part 2422B. Accordingly, the second fine delay parts 2424A and 2424B may include three or more elements. When the second fine delay parts 2424A and 2424B include three or more elements, an interval among the sizes of the delay amounts of the elements may be adjusted by a designer. For example, the interval among the sizes of the delay amounts of the second fine delay parts 2424A and 2424B is set to be substantially equal to the interval among the sizes of the delay amounts of the first fine delay parts 2422A and 2422B.

The first detection parts 2426A and 2426B are configured to detect whether the feedback clock FB_CLK has a logic 'high' level or a logic 'low' level at preset edges of the plurality of first fine delay clocks LDLY_DLLCLK1 and LDLY_DLLCLK2, and to determine the logic levels of the plurality of first detection signals EARLY1 and EARLY2. At this time, the number of elements included in the first detection parts 2426A and 2426B is determined corresponding to the number of elements included in the first fine delay parts 2422A and 2422B. That is, differently from FIG. 3, when the first fine delay parts delay the delay locked clock DLLCLK at three stages to generate three first fine delay clocks, the first detection parts also determine the logic level of the feedback clock FB_CLK at preset edges of the three first fine delay clocks, and generate three first detection signals.

Similarly, the third detection parts 2428A and 2428B are configured to detect whether the delay locked clock DLLCLK has a logic "high" level or a logic "low" level at preset edges of the plurality of second fine delay clocks LDLY_FBCLK1 and LDLY_FBCLK2, and to determine the logic levels of the plurality of third detection signals LATE1 and LATE2. At this time, the number of elements included in the third detection parts 2428A and 2428B is determined corresponding to the number of elements included in the second fine delay parts 2424A and 2424B. That is, differently from FIG. 3, when the second fine delay parts delay the feedback clock FB_CLK at three stages to generate three second fine delay clocks, the third detection parts also determine the logic level of the delay locked clock DLLCLK at preset edges of the three second fine delay clocks, and generate three second detection signals.

The second detection part 2427 is configured to detect whether the feedback clock FB_CLK has a logic "high" level or a logic "low" level at a preset edge of the delay locked clock DLLCLK, and to determine the logic level of the second detection signal FINE.

In brief, a result obtained by comparing the phase of the feedback clock FB_CLK with the phase of the delay locked clock DLLCLK is reflected in the second detection signal FINE outputted from the second detection part 2427, so that it is possible to determine whether the delay locked clock DLLCLK has a phase earlier than that of the feedback clock FB_CLK based on the logic level of the second detection signal FINE. That is, when the second detection signal FINE has a logic "high" level and the phase of the feedback clock FB_CLK is earlier than that of the delay locked clock DLLCLK, it has only to check the logic levels of the third detection signals LATE1 and LATE2 regardless of the logic levels of the first detection signals EARLY1 and EARLY2. Meanwhile, when the second detection signal FINE has a logic "low" level and the phase of the feedback clock FB_CLK is delayed as compared with the delay locked clock DLLCLK, it has only to check the logic levels of the first detection signals EARLY1 and EARLY2 regardless of the logic levels of the third detection signals LATE1 and LATE2.

Consequently, the delay replica adjustment signal output section 244 further increases the value of the delay replica adjustment signal VA_REPLICA according to an increase in the number of signals activated to a logic "high" level of the plurality of the first detection signals EARLY1 and EARLY2 in the state in which the second detection signal FINE has been deactivated to a logic "low" level, and further decreases the value of the delay replica adjustment signal VA_REPLICA according to an increase in the number of signals deactivated to a logic 'low' level of the plurality of the third detection signals LATE1 and LATE2 in the state in which the second detection signal FINE has been activated to a logic "high" level.

Furthermore, increasing or decreasing the value of the delay replica adjustment signal VA_REPLICA represents that the delay replica adjustment signal VA_REPLICA includes a plurality of bits. That is, the delay replica adjustment signal VA_REPLICA may be obtained by ply combining the first detection signals EARLY1 and EARLY2, the second detection signal FINE, and the third detection signals LATE1 and LATE2 with one another, or obtained by encoding and compressing the first detection signals EARLY1 and EARLY2, the second detection signal FINE, and the third detection signals LATE1 and LATE2.

For example, when the delay replica adjustment signal VA_REPLICA is obtained by simply combining the first detection signals EARLY1 and EARLY2, the second detection signal FINE, and the third detection signals LATE1 and LATE2 with one another, it is expressed by Table 1 below. That is, as the number of bits at a logic "high" level of a plurality of bits included in the delay replica adjustment signal VA_REPLICA is large, the value of the delay replica adjustment signal VA_REPLICA is small. Meanwhile, as the number of bits at a logic "low" level of the plurality of bits included in the delay replica adjustment signal VA_REPLICA is large, the value of the delay replica adjustment signal VA_REPLICA is large,

| EARLY 1 | EARLY 2 | FINE | LATE 1 | LATE 2 | E-FUSE OPTION |
|---|---|---|---|---|---|
| L | L | L | L | L | EFUSE<1>activation/ EFUSE<2:6>activation DLLCLK+tVREF<1>=PFB_CLK |
| H | L | L | L | L | EFUSE<1:2>activation/ EFUSE<3:6>activation DLLCLK+tVREF<1:2>=PFB_CLK |
| H | H | L | L | L | EFUSE<1:3>activation/ EFUSE<4:6>activation DLLCLK+tVREF<1:3>=PFB_CLK |
| H | H | H | L | L | EFUSE<1:4>activation/ EFUSE<5:6>activation DLLCLK+tVREF<1:4>=PFB_CLK |
| H | H | H | H | L | EFUSE<1:5>activation/ EFUSE<6>activation DLLCLK+tVREF<1:5>=PFB_CLK |
| H | H | H | H | H | EFUSE<1:6>activation DLLCLK+tVREF<1:6>=PFB_CLK |

Similarly, when the delay replica adjustment signal VA_REPLICA is obtained by encoding and compressing the first detection signals EARLY1 and EARLY2, the second detection signal FINE, and the third detection signals LATE1 and LATE2, it is expressed by Table 2 below. That is, it is possible to determine whether the value of the delay replica adjustment signal VA_REPLICA is small or large according to the size of a binary represented by the plurality of bits included in the delay replica adjustment signal VA_REPLICA.

TABLE 2

| EARLY 1 | EARLY 2 | FINE | LATE 1 | LATE 2 | Encoding code | E-FUSE OPTION |
|---|---|---|---|---|---|---|
| L | L | L | L | L | 001 | EFUSE<1> activation/EFUSE <2:6> activation DLLCLK + tVREF <1> = PFB_CLK |
| H | L | L | L | L | 010 | EFUSE<1:2> activation/EFUSE <3:6> activation DLLCLK + tVREF <1:2> = PFB_CLK |
| H | H | L | L | L | 011 | EFUSE<1:3> activation/EFUSE <4:6> activation DLLCLK + tVREF <1:3> = PFB_CLK |
| H | H | H | L | L | 100 | EFUSE<1:4> activation/EFUSE <5:6> activation DLLCLK + tVREF <1:4> = PFB_CLK |
| H | H | H | H | L | 101 | EFUSE<1:5> activation/EFUSE <6> activation DLLCLK + tVREF <1:5> = PFB_CLK |

TABLE 2-continued

| EARLY 1 | EARLY 2 | FINE | LATE 1 | LATE 2 | Encoding code | E-FUSE OPTION |
|---|---|---|---|---|---|---|
| H | H | H | H | H | 110 | EFUSE<1:6> activation DLLCLK + tVREF <1:6> = PFB_CLK |

Among the elements of the delay locked loop (DLL) circuit, in accordance with an exemplary embodiment illustrated in FIG. 2, the variable delay replica modeling section 224 includes a delay control decoding part 2242 and a plurality of delay adjustment parts 2244<1:6>. The delay control decoding part 2242 is configured to decode the delay replica adjustment signal VA_REPLICA and generate delay control codes LDCON_CODE<1:6>. The plurality of delay adjustment parts 2244<1:6> are configured to receive the delay locked clock DLLCLK through a delay input terminal LIDCON_IND, to output the pre-feedback clock PFB_CLK through a delay output terminal LDCON_OUTD, and to be connected between the delay input terminal LDCON_IND and the delay output terminal LDCON_OUTD in a chain manner to have preset fine delay amounts, wherein the application of the delay amounts is determined in response to bits of the delay control codes LDCON_CODE<1:6>.

The delay control decoding part 2242 is configured to perform a decoding operation through a plurality of electrical control fuses EFUSE<1:6> that operate in response to the delay replica adjustment signal VA_REPLICA, and to set the values of the delay control codes LDCON_CODE<1:6>. Furthermore, the operation of the delay control decoding part 2242 is on/off controlled according to the activation or deactivation of the delay replica adjustment signal VA_REPLICA.

Connections of the electrical control fuses EFUSE<1:6> are controllable by electrical control. That is, it indicates "Electrically Fuse option" and the fuses are mainly classified into anti-fuses, which are switched from an open state to a short state by electrical control, and E-fuses which are switched from a short state to an open state by electrical control. Since this is well-known in the art, a more detailed description thereof will be omitted.

The fact that the operation of the delay control decoding part 2242 is on/off controlled in response to the delay replica adjustment enable signal EN_VA_REPLICA and the delay control decoding part 2242 sets the values of the delay control codes LDCON_CODE<1:6> using the plurality of electrical control fuses EFUSE<1:6> represents that when the values of the delay control codes LDCON_CODE<1:6> are set by the electrical control fuses EFUSE<1:6> in an activation period of the delay replica adjustment enable signal EN_VA_REPLICA, the values of the delay control codes LDCON_CODE<1:6> are substantially maintained as is without a change even in a deactivation period of the delay replica adjustment enable signal EN_VA_REPLICA.

A scheme by which the values of the delay control codes LDCON_CODE<1:6> are set according to the value of the delay replica adjustment signal VA_REPLICA, may refer to Table 1 and Table 2 above. That is, the value of the delay replica adjustment signal VA_REPLICA is increased, resulting in an increase in the number of delay adjustment parts, delay amounts of which are to be applied, among the plurality of delay adjustment parts 2244<1:6>. Meanwhile, the value of the delay replica adjustment signal VA_REPLICA is decreased, resulting in a decrease in the number of delay adjustment parts, delay amounts of which are to be applied, among the plurality of delay adjustment parts 2244<1:6>.

Furthermore, the plurality of delay adjustment parts 2244<1:6> illustrated in FIG. 3 are configured to be activated when the delay control codes LDCON_CODE<1:6> corresponding to respective delay adjustment parts are "1," to apply their delay amounts to an input signal, and to output a delayed signal, and to be deactivated when the delay control codes LDCON_CODE<1:6> corresponding to the respective delay adjustment parts are "0," and to bypass an input signal without applying their delay amounts. Since the configuration of such a delay circuit is well-known in the art, a more detailed description will be omitted.

As described above, when an exemplary embodiment is applied, the operation for detecting a phase difference between the delay locked clock DLLCLK and the feedback clock FB_CLK and adjusting the delay amount of the delay replica modeling circuit is performed in the delay locked loop (DLL) circuit, so that it is possible for the delay locked loop (DLL) circuit to adjust clock-related specifications by itself.

Consequently, even after a semiconductor device is packaged, clock-related specifications are adjustable in the semiconductor device, so that it is possible to minimize a time required for a test.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a delay locked loop unit configured to compare a phase of an internal clock with a phase of a feedback clock to delay the internal clock by a delay amount corresponding to a comparison result, and to output a delay locked clock;
   a delay replica modeling unit configured to output the feedback clock by reflecting a transfer delay amount of the internal clock used in an internal circuit into the delay locked clock, and to adjust the transfer delay amount in response to a delay replica adjustment signal; and
   a delay replica adjustment signal generation unit configured to compare the phase of the feedback clock with a phase of the delay locked clock, and to set a value of the delay replica adjustment signal in response to a comparison result.

2. The semiconductor device of claim 1, wherein the delay replica modeling unit comprises:
   a variable delay replica modeling section configured to delay the delay locked clock by a first delay amount changed in response to the delay replica adjustment signal, and output a pre-feedback clock; and
   a fixed delay replica modeling section configured to delay the pre-feedback clock by a second delay amount, and output the feedback clock to the delay locked loop unit.

3. The semiconductor device of claim 2, wherein the variable delay replica modeling section comprises:
   a delay control decoding part configured to generate a delay control code by decoding the delay replica adjustment signal; and
   a plurality of delay adjustment parts, connected in sequence between a delay input terminal and a delay output terminal, configured to receive the delay locked clock through the delay input terminal, and output the pre-feedback clock through the delay output terminal, wherein each delay adjustment part of the plurality of delay adjustment parts provides a delay amount based on the delay control code.

4. The semiconductor device of claim 3, wherein the delay control decoding part comprises:
   a plurality of fuses configured to decode the delay replica adjustment signal, and set a value of the delay control code.

5. The semiconductor device of claim 4, wherein the delay replica adjustment signal generation unit and the delay control decoding part are activated or deactivated in response to a delay replica adjustment enable signal.

6. The semiconductor device of claim 1, wherein the delay replica adjustment signal generation unit comprises:
   a phase detection section configured to receive the delay locked clock as a sampling clock, receive the feedback clock as a target clock, and detect a phase difference between the delay locked clock and the feedback clock; and
   a delay replica adjustment signal output section configured to output the delay replica adjustment signal having a value that is adjusted based on an output signal of the phase detection section.

7. The semiconductor device of claim 6, wherein the phase detection section comprises:
   a first fine delay part configured to finely delay the delay locked clock by a preset number of times step by step, and to generate a plurality of first fine delay clocks;
   a second fine delay parts configured to finely delay the feedback clock by a preset number of times step by step, and to generate a plurality of second fine delay clocks;
   a first detection part configured to detect a logic level of the feedback clock at preset edges of the plurality of first fine delay clocks, and to generate a plurality of first detection signals;
   a second detection part configured to detect a logic level of the feedback clock at a preset edge of the delay locked clock, and to generate a second detection signal; and
   a third detection part configured to detect logic levels of the plurality of second fine delay clocks at the preset edge of the delay locked clock, and to generate a plurality of third detection signals.

8. The semiconductor device of claim 7, wherein the delay replica adjustment signal output section is configured to:
   increase the value of the delay replica adjustment signal if a number of active first detection signals, of the plurality of first detection signals, increases, and the second detection signal has been deactivated, or
   decrease the value of the delay replica adjustment signal if a number of active third detection signals, of the plurality of third detection signals, increases, and the second detection signal has been activated.

9. The semiconductor device of claim 1, further comprising:
   a first clock transfer control unit, provided between the delay replica modeling unit and the delay replica adjustment signal generation unit, configured to control, in response to a delay replica adjustment enable signal, a communication of the feedback clock to the delay replica adjustment signal generation unit; and
   a second clock transfer control unit, provided between the delay locked loop unit and the delay replica adjustment signal generation unit, configured to control, in response to the delay replica adjustment enable signal, a communication of the delay locked clock to the delay replica adjustment signal generation unit.

10. The semiconductor device of claim 1, further comprising:
    a first repeater, provided between the delay replica modeling unit and the delay replica adjustment signal generation unit, configured to repeat a transfer of the feedback clock; and
    a second repeater, provided between the delay locked loop unit and the delay replica adjustment signal generation unit, configured to repeat a transfer of the delay locked clock.

11. The semiconductor device of claim wherein the delay locked loop unit further comprises:
    an input buffering section configured to buffer an external clock and output the internal clock;
    a phase comparison section configured to compare the phase of the internal clock with the phase of the feedback clock, and generate a comparison result;
    a variable delay section configured to receive the internal clock, delay the internal clock by a delay amount corresponding to the comparison result, and output the delay locked clock; and
    an output buffering section configured to buffer the delay locked clock, and output a delay clock to an external device.

12. The semiconductor device of claim 11, further comprising:
    a transfer buffering unit, having a buffering capacity substantially equal to a buffering capacity of the output buffering section, configured to buffer the delay locked clock, and communicate a buffered delay locked clock to the delay replica adjustment signal generation unit.

13. A semiconductor device comprising:
    a delay locked loop unit configured to delay an internal clock by a delay amount based on a phase difference between the internal clock and a feedback clock, and output a delay locked clock;
    a delay replica modeling unit configured to generate the feedback clock based on the delay locked clock and a transfer delay amount that is based on a phase difference between the feedback clock and the delay locked clock; and
    a repeater unit configured to repeat the feedback clock and the delay locked clock inputted to the delay replica modeling unit.

14. The semiconductor device of claim 13, wherein the transfer delay amount includes a first delay amount having a size determined corresponding to the phase difference between the feedback clock and the delay locked clock, and a second delay amount having a fixed value that is determined by modeling a clock transmission path.

15. The semiconductor device of claim 14, wherein the delay replica modeling unit further is to:
    determine the first: delay amount during an activation period of a delay replica adjustment enable signal, and
    substantially maintain the first delay amount during a deactivation period of the delay replica adjustment enable signal.

16. A method comprising:
    comparing, via a delay locked loop unit, a phase of an internal clock with a phase of a feedback clock to generate a comparison result;
    delaying, via the delay locked loop unit, the internal clock by a delay amount corresponding to the comparison result;
    outputting, via the delay locked loop unit, a delay locked clock;
    receiving, via a delay replica modeling unit, the delay locked clock;

generating, via the delay replica modeling unit, the feedback clock based on a transfer delay amount of the internal clock;

adjusting, via the delay replica modeling unit, the transfer delay amount based on a delay replica adjustment signal;

comparing, via a delay replica adjustment signal generation unit, the phase of the feedback clock with a phase of the delay locked clock;

setting, via the delay replica adjustment signal generation unit, a value of the delay replica adjustment signal based on the comparison; and outputting, via the delay replica adjustment signal generation unit, the delay replica adjustment signal to the delay replica modeling unit.

17. The method of claim 16, wherein the generating of the feedback clock comprises:

delaying, via a variable delay replica modeling section, the delay locked clock by a first delay amount based on the delay replica adjustment signal;

outputting, via the variable delay replica modeling section, a pre-feedback clock;

delaying, via a fixed delay replica modeling section, the pre-feedback clock by a second delay amount; and outputting, via the fixed delay replica modeling section the feedback clock to the delay locked loop unit.

18. The method of claim 17, wherein the delaying of the delay locked clock by the first delay amount the variable delay replica modeling section comprises:

decoding, via the variable delay replica modeling section, the delay replica adjustment signal;

generating, via the variable delay replica modeling section, a delay control code based on the delay replica adjustment signal;

receiving, via the variable delay replica modeling section, the delay locked clock through a delay input terminal;

delaying, via the variable delay replica modeling section, the delay locked clock a delay amount based on the delay control code; and outputting, via the variable delay replica modeling section, the pre-feedback clock through a delay output terminal.

19. The method of claim 16, further comprising:

receiving, via a phase detection section, the delay locked clock as a sampling clock;

receiving, the feedback clock as a target clock;

detecting, via the phase detection section, a phase difference between the delay locked clock and the feedback clock;

generating an adjusted delay replica adjustment signal having a value that is adjusted based on an output signal of the phase detection section; and outputting, via an adjusted delay replica adjustment signal output section, the adjusted delay replica adjustment signal.

20. The method of claim 16, further comprising:

buffering, via an input buffering section an external clock;

outputting, via the input buffering section the internal clock;

comparing, via a phase comparison section, the phase of the internal clock with the phase of the feedback clock;

generating, via a phase comparison section, the comparison result;

receiving, via a variable delay section, the internal clock;

delaying, via the variable delay section, the internal clock by the delay amount corresponding to the comparison result;

outputting, via the variable delay section, the delay locked clock;

receiving, via an output buffering section, the delay locked clock;

buffering, via the output buffering section the delay locked clock; and outputting, via the output buffering section a delay clock to an external device.

* * * * *